(12) United States Patent
Kim et al.

(10) Patent No.: US 6,620,681 B1
(45) Date of Patent: Sep. 16, 2003

(54) SEMICONDUCTOR DEVICE HAVING DESIRED GATE PROFILE AND METHOD OF MAKING THE SAME

(75) Inventors: Min Kim, Kyungki-do (KR); Sung-tae Kim, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 189 days.

(21) Appl. No.: 09/658,383

(22) Filed: Sep. 8, 2000

(51) Int. Cl.[7] ............................................. H01L 21/336
(52) U.S. Cl. ...................... 438/257; 438/296; 438/593
(58) Field of Search ................................ 438/257, 296, 438/593, FOR 203

(56) References Cited

U.S. PATENT DOCUMENTS

| | | | |
|---|---|---|---|
| 5,342,478 A | * 8/1994 | Welbourn | |
| 5,847,427 A | * 12/1998 | Hagiwara | |
| 5,858,840 A | * 1/1999 | Hsieh et al. | |
| 6,013,551 A | 1/2000 | Chen et al. | ................ 438/264 |
| 6,027,971 A | 2/2000 | Cho et al. | |
| 6,057,580 A | 5/2000 | Watanabe et al. | ........... 257/396 |
| 6,159,801 A | * 12/2000 | Hsieh et al. | |
| 6,180,980 B1 | * 1/2001 | Wang | |
| 6,222,225 B1 | * 4/2001 | Nakamura et al. | |
| 6,235,589 B1 | * 5/2001 | Meguro et al. | |
| 6,281,050 B1 | * 8/2001 | Sakagami et al. | |
| 6,358,796 B1 | * 3/2002 | Lin et al. | |

OTHER PUBLICATIONS

"A 0.24$\mu m^2$ Cell Process with 0.18–$\mu m$ Width Isolation and 3–D Interpoly Dielectric Films for 1–Gb Flash Memories," Kobayashi et al., Central Research Laboratory, Hitachi, Ltd. Tokyo, Japan.

* cited by examiner

*Primary Examiner*—George Fourson
*Assistant Examiner*—Joannie Adelle Garcia
(74) *Attorney, Agent, or Firm*—Lee & Sterba, P.C.

(57) ABSTRACT

In a method of manufacturing a non-volatile memory or other semiconductor device, a control gate made of conductive material is formed in a more uniform fashion. The method includes forming a silicon layer on a buffer oxide layer on a semiconductor substrate. After forming the buffer oxide layer, a stopping layer is formed. The control gate of conductive material, such as a floating gate in an EEPROM memory device, is provided by patterning the silicon layer, gate oxide layer, and the substrate, and then, a trench is formed in the upper portion of the substrate. Uniformity is achieved by oxidizing the sidewalls of the trench to create bird's beaks at both upper and lower portions of the control gate material. Then, a field oxide layer that fills up the trench is formed. Because bird's beaks are evenly formed at both upper and lower portions of the control gate material during oxidation of the sidewalls of the trench, it is formed in a more uniform fashion since achieves uniformity is attained by preventing the sidewalls of the floating gate, for example, from having positive slopes.

20 Claims, 10 Drawing Sheets

SEMICONDUCTOR DEVICE HAVING DESIRED GATE PROFILE AND METHOD OF MAKING THE SAME

BACKGROUND OF THE INVENTION

1. Field of the Invention

The present invention relates to a control gate, such as a floating gate in a memory device, and a method of making the same, but more particularly to a self-aligned shallow trench isolation technique that simultaneously forms a gate and an active region thereof.

2. Description of the Related Art

During the manufacture of memory devices, the packing density of cells is primarily determined by the layout of cells within the array and the physical dimensions of the cells themselves. Below the half-micron design rule, scalability is limited by photolithographic resolution attainable during manufacturing and by alignment tolerances of masks used during production. Alignment tolerances are, in turn, limited by mechanical techniques employed to form masks and the techniques used to register these masks between layers. Because alignment errors accumulate during multi-stage fabrication, it is preferable to use as few masks as possible. Fewer masks minimizes the likelihood of misalignment. Accordingly, "self-alignment" processing steps have been developed to produce semiconductor devices.

Isolation structures, e.g., field oxides, between individual cells within the memory cell array consume regions of the chip that are otherwise useful for active circuitry. Thus, in order to increase the packing density of memory cells and active circuits within the substrate, it is desirable to minimize the size of these isolation structures. However, the size of the isolation structure is generally dictated by their process of formation and/or the alignment of this structure.

Typically, an isolation structure is grown at various regions of the chip by a thermal field oxidation process, such as a LOCal Oxidation of Silicon (hereinafter referred to as "LOCOS"). According to the LOCOS method, after a pad oxide layer and a nitride layer are successively formed, the nitride layer is subjected to patterning. Then, the patterned nitride layer is used as a mask to selectively oxidize the silicon substrate to form field oxide regions. However, in considering the LOCOS isolation, the growth of oxide may encroach upon the side plane of the pad oxide layer at a lower portion of the nitride layer serving as the mask during selective oxidation of the silicon substrate, thereby creating what is called a bird's beak at the end portion of the field oxide layer. Due to the bird's beak, the field oxide layer extends into the active region of the memory cell thereby decreasing the width of the active region. This phenomenon is undesirable because it degrades the electrical characteristics of the memory device.

For this reason, a shallow trench isolation (hereinafter referred to as "STI") structure is attractive in making ultra-high scale semiconductor devices. In the STI process, a silicon substrate is first etched to form a trench, and then an oxide layer is deposited to fill up the trench. Thereafter, the oxide layer is etched via an etch back or a chemical mechanical planarizing (CMP) method so as to form a field oxide layer inside the trench.

The foregoing LOCOS and STI methods commonly include a mask step that defines the regions on the substrate of the isolation structure and a step that forms the field oxide layer within those regions. After forming the isolation structure, steps to form the memory cells are carried out. As such, alignment errors associated with forming the isolation structure and memory cells aggregate to induce misalignment, which may result in failure of the device.

When making a floating gate of a non-volatile memory device, for example, one method of reducing misalignment includes forming LOCOS isolation structure using a self-aligned floating gate, such as by the process disclosed in U.S. Pat. No. 6,013,551 (issued to Jong Chen, et al.). According to the methods described therein, a floating gate and active region thereof are simultaneously defined and fabricated using a single mask so that alignment errors do not aggregate.

Non-volatile memory devices are used in flash memory devices and have long-time storage capacity, e.g., almost indefinitely. In recent years, demand for such electrically programmable flash memory devices, EEPROMS for example, has increased. Memory cells of these devices generally have a vertically stacked gate structure comprising a floating gate formed at an upper portion of the silicon substrate. The multi-layer gate structure typically includes one or more tunnel oxide or dielectric layers and a control gate over and/or around the floating gate. In a flash memory cell having this structure, data is stored by transferring electrons to and from the floating gate, which is achieved by applying a controlled voltage to the control gate and substrate. The dielectric functions to maintain the potential on the floating gate.

Even though self-aligned STI processes have an advantage of simultaneously forming floating gates and active regions, there is still a drawback because the aspect ratio of gaps formed in the process is increased, which is likely to form seams or voids within the trench during the gap filling. Also, when using a high density plasma (hereinafter referred to as "HDP") oxide layer to fill these gaps, the edge portion of a polishing end-point detecting layer underlying the HDP oxide layer becomes eroded during deposition of the HDP oxide layer, which undesirably provides a negative slope at the field oxide region. For this reason, gate residues are generated around the bottom of the sloped portion of the field regions during subsequent gate etching procedures.

The above-described problems can be solved by optimizing the conditions during deposition of the HDP oxide layer to enhance the gap filling capability or by using a method that eliminates the negative slope at the field region by means of a wet etchant.

FIGS. 1A to 1E are perspective views of a substrate illustrating in succession a method of manufacturing a conventional flash memory device using a self-aligned STI technique.

Referring to FIG. 1A, after forming a gate oxide layer (i.e., tunnel oxide layer) 11 on a silicon substrate 10, a first polysilicon layer 13 and a nitride layer 15 are successively formed on the gate oxide layer 11.

Referring to FIG. 1B, a photolithography process is performed to pattern the nitride layer 15, the first polysilicon layer 13, and the gate oxide layer 11 to form a nitride layer pattern 16, a first floating gate 14, and a gate oxide layer pattern 12. Thereafter, exposed portions of the substrate 10 are etched to a predetermined depth to form trench 18. That is, the active regions and floating gates are simultaneously defined during the trench forming process using a single mask.

Referring to FIG. 1C, exposed portions of the trench 18 are subjected to thermal treatment in ambient oxygen atmosphere for curing the silicon damage caused by high energy ion impact during the trench etching process. By doing so, a trench oxide layer 20 is formed along the inner surface including the bottom plane and sidewall of the trench 18 by the oxidation reaction of the exposed silicon with an oxidant.

During the above oxidizing process, the oxidant encroaches upon the side of the gate oxide layer pattern 12 at the lower portion of the first floating gate 14 to form the bird's beaks at both ends of the gate oxide layer pattern 12. Because of the bird's beaks, the bottom edge portions of the first floating gate 14 are bent outward while both end portions of the gate oxide layer pattern 12 expand, the lower portions of the sidewalls of the first floating gate 14 have positive slope. Here, the positive slope denotes that the slope allows the sidewall erosion with respect to the etchant. In other words, as shown in the drawing, the intrusion of the oxidant into the portion underlying the nitride layer pattern 16 is blocked by the existence of the nitride layer pattern 16 to provide the negative slope at the upper portion of the sidewall of the first floating gate 14. Meanwhile, the bottom edge portion of the lower portion of the first floating gate 14 is bent outward to have a positive slope, which is eroded by etchant introduced from the upper portion of the substrate in the same manner as in the sidewall of a mesa structure or to act as a stopping layer of the underlying layer when the etchant is applied, which is undesirable.

Referring to FIG. 1D, after forming an oxide layer (not shown) via a chemical vapor deposition (hereinafter referred to as "CVD") method for filling up the trench 18, the CVD-oxide layer is removed via a CMP process until the upper surface of the nitride layer 16 pattern is exposed. As the result, a field oxide layer 22 including the trench oxide layer 18 is formed inside the trench 18.

After removing the nitride layer pattern 16 via a phosphoric acid stripping process, a material identical to that of the first polysilicon layer 13 is deposited to form a second polysilicon layer (not shown) for the purpose of forming a second floating gate on the upper portion of the first floating gate 14 and the field oxide layer 22. The second polysilicon layer over the field oxide layer 22 is partially etched via a photolithography process to form a second floating gate 24 in a cell that is separated from those of neighboring cells. The second floating gate 24 electrically contacts the first floating gate 14 and functions to increase the area of the dielectric interlayer which is formed in a subsequent process.

Then, an ONO dielectric interlayer 26 and a control gate layer 28 are successively formed on the entire surface of the resultant structure. The control gate layer 28 is generally formed by a polycide structure obtained by stacking a doped polysilicon layer and a tungsten silicide layer.

In FIG. 1E, the control gate layer 28 is patterned via a photolithography process. Successively, the exposed dielectric interlayer 26 and the second and first floating gates 24 and 14 are anisotropically etched via a dry etch process to complete the non-volatile memory device.

At this time, as shown in the portion denoted by a dotted line A in FIG. 1D, the lower portion of the sidewall of the first floating gate 14 has a positive slope. Therefore, by the characteristic of the anisotropic etching (i.e., where etching is performed only in the vertical direction) of the dry etch process, the bottom edge portion of the first floating gate 14 masked by the field oxide layer 22 is not etched to remain intact. As the result, a line-shaped polysilicon residues 14a is formed along the surface boundary of the field oxide layer 22 and the active region. The polysilicon residue 14a forms an electrical bridge between adjacent floating gates, which causes an electrical fail of the device.

SUMMARY OF THE INVENTION

Therefore, it is an object of the present invention to provide a method of manufacturing a non-volatile memory or other device having a gate or other conductive structure of a desired profile, such as a floating gate structure in a flash memory device, that avoids a positive slope on sidewalls thereof during formation.

To achieve the above aspect of the invention, there is provided a self-alignment method of making and a corresponding semiconductor device that includes a floating gate and an associated active region thereof. The floating gate and active region are formed in a substrate of a semiconductor memory device in a region bounded at least, in part, by a field oxide region formed in a trench. The trench is formed together with forming at least a first segment of the floating gate. The method includes uniformly forming an oxide at sidewalls of a first segment of the floating gate by, prior to forming the trench, forming a buffer layer over a first segment of the gate and subsequently removing the buffer layer. This achieves more even oxidation of sidewalls of the first segment before layering at least another segment of conductive material over the first segment of the floating gate.

In another embodiment, a gate oxide layer is formed on a semiconductor substrate, a first conductive layer is formed on the gate oxide layer, and a buffer layer (e.g., an oxide layer) is formed on the first conductive layer. Then, a stopping layer is formed on the buffer layer, and the stopping layer and buffer layer are patterned to form a stopping layer pattern and a buffer layer pattern. Thereafter, the first conductive layer and the gate oxide layer are patterned to form a floating gate layer as a first conductive layer pattern and a gate oxide layer pattern, and the upper portion of the substrate is etched to form a trench. The inner surface portion of the trench is oxidized to form a trench oxide layer along the inner surface of the trench, and bird beaks are formed at the upper and lower portions of the floating gate layer to prevent the formation of a positive profile at the sidewall of the patterned floating gate layer. Finally, a field oxide layer is formed for filling up the trench.

Furthermore, to achieve the above features of the invention, a method of manufacturing a memory device is carried out by forming a gate oxide layer on a semiconductor substrate, forming a first conductive layer on the gate oxide layer, and forming a buffer layer, such as an oxide layer, on the first conductive layer. Then, a stopping layer is formed on the buffer layer. The stopping layer, the buffer layer, the first conductive layer, the gate oxide layer and substrate are patterned by using a single mask for forming a floating gate from the first conductive layer. Also, simultaneously, a trench aligned with the floating gate is formed within the substrate adjacent to the floating gate for defining an active region of the substrate. Thereafter, the inner surface portion of the trench is oxidized to form a trench oxide layer along the inner surface of the trench, and birds beaks are formed at the upper and lower portions of the floating gate layer to prevent the formation of a positive profile at the sidewall of the patterned floating gate layer. Finally, a field oxide layer is formed for filling up the trench.

According to another aspect of the invention, a buffer layer is formed between the floating gate layer and the nitride layer which is used as an oxidation mask layer to generate the birds beaks at both the upper and lower portions of the floating gate layer during the subsequent oxidizing of the sidewalls. By doing so, the bird's beaks prevent the sidewalls of the floating gate layer from having the positive slope, which prevents failure of the device induced by the gate residues during following etching of the gate.

In addition to methods, the invention further includes a floating gate semiconductor memory device and components thereof as defined by the appended claims.

BRIEF DESCRIPTION OF THE DRAWINGS

The above features and other advantages of the present invention will become more apparent with reference to the illustrative embodiments taken in connection with the attached drawings in which:

FIGS. 2A to 2I illustrate a method of manufacturing a floating gate of a non-volatile memory device according to a first embodiment of the present invention;

DESCRIPTION OF ILLUSTRATIVE EMBODIMENTS

Hereinafter, the preferred embodiment of the present invention is described with reference to the accompanying drawings. Whenever a layer, structure, or pattern is described herein as being on, lying over, or covers another layer, pattern, or structure it is meant that an interceding layer, pattern, or structure may or may not be included.

FIGS. 2A to 2I are perspective views illustrating a method of manufacturing a non-volatile memory device according to a first aspect of the invention.

Figure 2A:
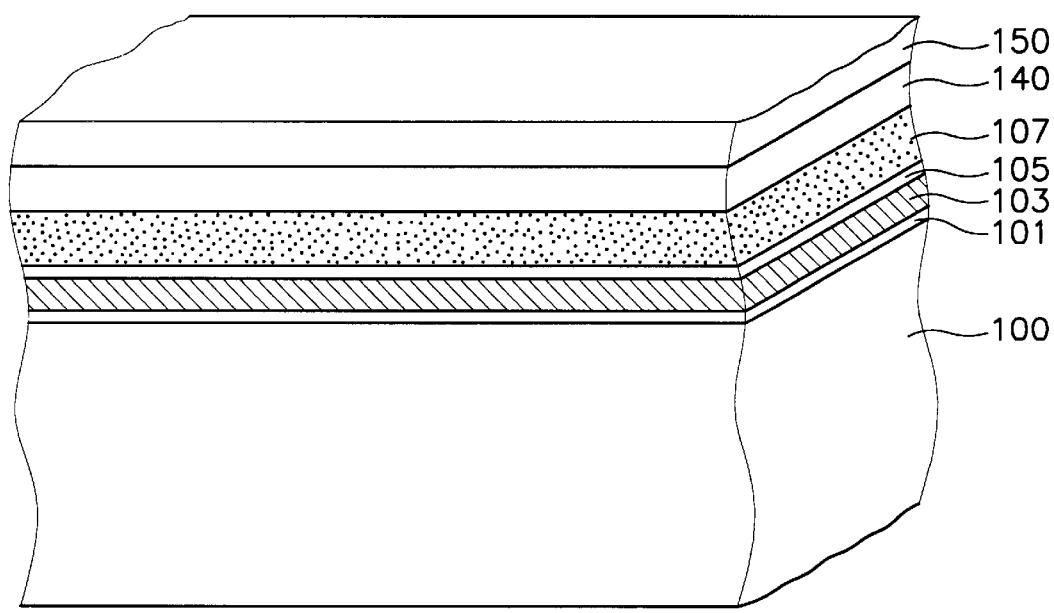

Referring to FIG. 2A, a silicon oxide layer or silicon oxynitride layer is grown on a semiconductor substrate 100 comprising a semiconductor substrate, comprising a material such as a silicon, to form a gate oxide layer (e.g., tunnel oxide layer) 101 of a transistor cell. A native oxide layer is formed on the semiconductor substrate 100 when its surface is exposed to and reacts with oxygen in an atmosphere. Accordingly, the native oxide layer may be formed on the semiconductor substrate 100 by known methods that are not illustrated in the drawings. In the illustrated embodiment, gate oxide layer 101 is grown in an oxygen atmosphere to a thickness of about 10 to 500 Å, preferably to about 75 Å, in case of a low voltage semiconductor device or to about 300 Å in case of a high voltage semiconductor device, exclusive of the native oxide layer.

A first silicon layer 103 which is to be used as a floating gate is formed on the gate oxide layer 101 to the thickness of about 200 to 1500 Å, preferably 500 Å, via the LPCVD method. Then, layer 103 is doped with a high-density N-type impurity via a typical doping method, e.g., $POCl_3$ diffusion, ion implantation or in-situ doping, etc. Preferably, silicon layer 103 comprises polysilicon or amorphous silicon. Next, the silicon layer 103 is exposed to the oxygen atmosphere to form a native oxide layer (not shown in the drawings) to the thickness of about 30 to 35 Å.

A buffer layer 105 is then formed on the first silicon layer 103 to the thickness of about 10 to 500 Å, which is approximately the same thickness as gate oxide layer 101 (excluding the thickness of the native oxide layer). The buffer layer 105 may be an oxide layer formed by thermal oxidation or plasma-enhanced chemical vapor deposition (PE-CVD). Also, the buffer layer 105 may be formed by partially oxidizing a surface portion of silicon layer 103 via a plasma treatment by an oxidizing gas such as oxygen ($O_2$) or nitrousoxide ($N_2O$). A buffer material other than an oxide is also envisioned by the invention so long as it prevents irregular formation of the gate or achieves evening out or smoothing of the edges and/or sidewalls of the first or other segment of the gate during trench formation. As indicated above, the floating gate deforms or assumes an undesirable positive slope without using the buffer material prior to trench oxidation.

An etch stopping layer 107 is formed on buffer oxide layer 105 to the thickness of about 100 to 3000 Å, preferably 1500 Å, via a LPCVD method. The stopping layer 107 serves as an end-point detecting layer during subsequent CMP process or an etchback process. The stopping layer 107 covers the buffer oxide layer 105 during a subsequent thermal oxidation process of the trench and to help prevent encroachment of the oxygen and oxidant into the first silicon layer 103 via the buffer oxide layer 105. Accordingly, the stopping layer 107 is preferably formed by a material having the oxygen-resistant property, e.g., nitrides such as SiN, SiON or BN.

The stopping layer 107 may be formed by polysilicon. In this case, the stopping layer 107 is partially oxidized during the subsequent oxidation process. However, the stopping layer 107 also can be used as an end-point detecting layer during an etchback or CMP process.

Optionally, an anti-reflective layer is formed on the stopping layer 107 via a CVD method in order to accurately align a succeeding photolithography process. Such an anti-reflective layer may be formed of polysilicon, silicon oxide such as high temperature oxide, and medium temperature oxide or silicon oxynitride (SiON). The anti-reflective layer may comprise a single layer or a plurality of layers.

In the present invention, a dual layer formed by a high temperature oxide (hereinafter referred to as "HTO") layer 140 and a SiON layer 150 as the anti-reflective layer. The HTO layer 140 and the SiON layer 150 are easily formed via the well-known CVD method, which serve as the anti-reflective layer for preventing the reflection of light from the lower substrate during the photolithography process, which facilitates formation of the photoresist pattern. The HTO layer 140 is formed to the thickness of about 200 to 2000 Å, preferably 500 Å, and the SiON layer 150 is formed to the thickness of about 200 to 3000 Å, preferably 800 Å.

Figure 2B:
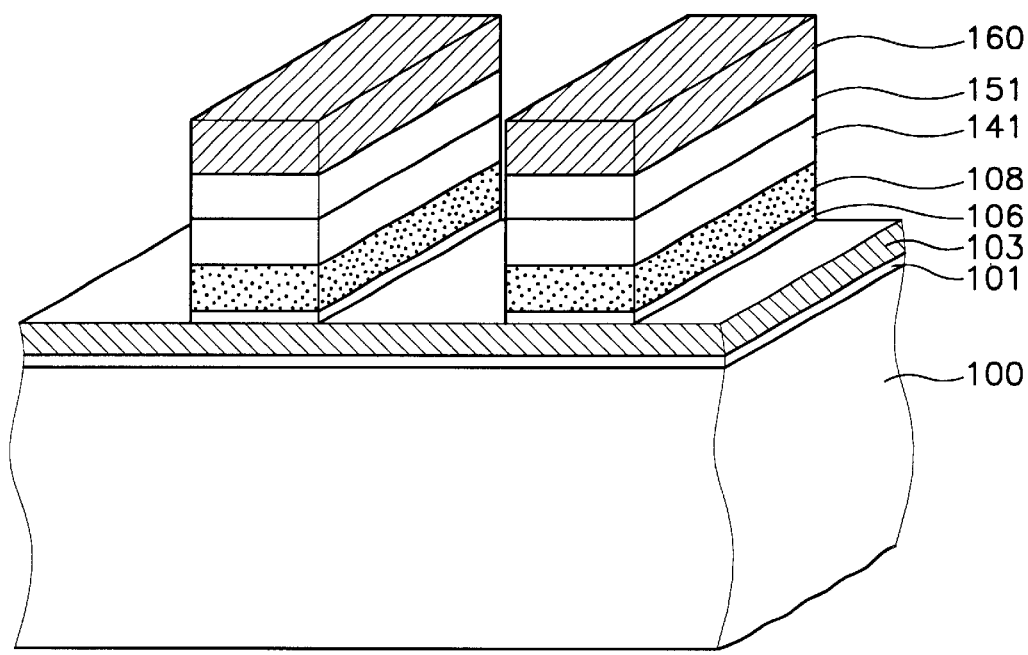

Referring to FIG. 2B, a photoresist is coated over the SiON layer 150 to form a photoresist film (not shown) via a spin coating. Thereafter, the photoresist film is exposed by using a photo mask and then developed to form a photoresist pattern 160 that defines the layout of the floating gates.

The photoresist pattern 160 is used as an etch mask to successively etch the SiON layer 150, the HTO layer 140, the stopping layer 107 and the buffer oxide layer 105. Thus, as shown in the drawing, a pattern formed of an SiON layer pattern 151, an HTO layer pattern 141, a stopping layer pattern 108, and a buffer oxide layer pattern 106 are formed. Then, the photoresist pattern 160 is removed via an ashing or a stripping process.

Figure 2C:
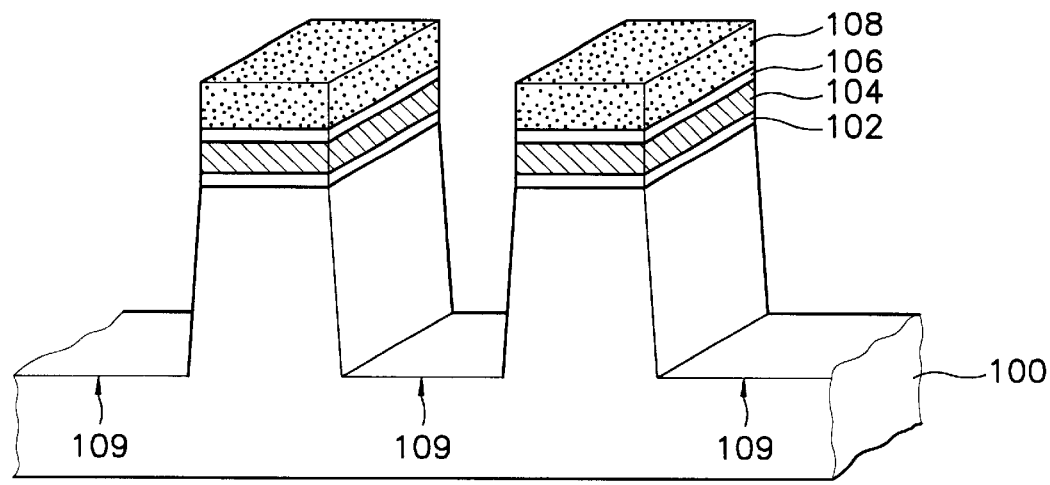

Referring to FIG. 2C, the resultant structure is moved to another etching chamber to perform an etching process upon the polysilicon and oxide. Here, an etching gas for etching the polysilicon is introduced to etch the first silicon layer 103, thereby forming a first silicon layer pattern 104. The first silicon layer pattern 104 formed at this time is used as the first floating gate of the non-volatile memory device.

Successively, in the same etching chamber, the gate oxide layer 101 is etched to form a gate oxide layer pattern 102 and the substrate 100 is etched to a depth of approximately 1000 to 5000 Å, preferably 2700 Å, to form a trench 109. As a result, the floating gates defined by silicon layer pattern 104 are separated from one another by trench 109.

During etching of silicon layer pattern 104 and upper portion of the semiconductor substrate 100, the SiON layer pattern 151 and the HTO layer pattern 141 formed on stopping layer pattern 108 are removed.

By forming trench 109, the active region and floating gate are simultaneously defined using a single mask. Accordingly, the floating gate is self-aligned with the active region.

Figure 2D:
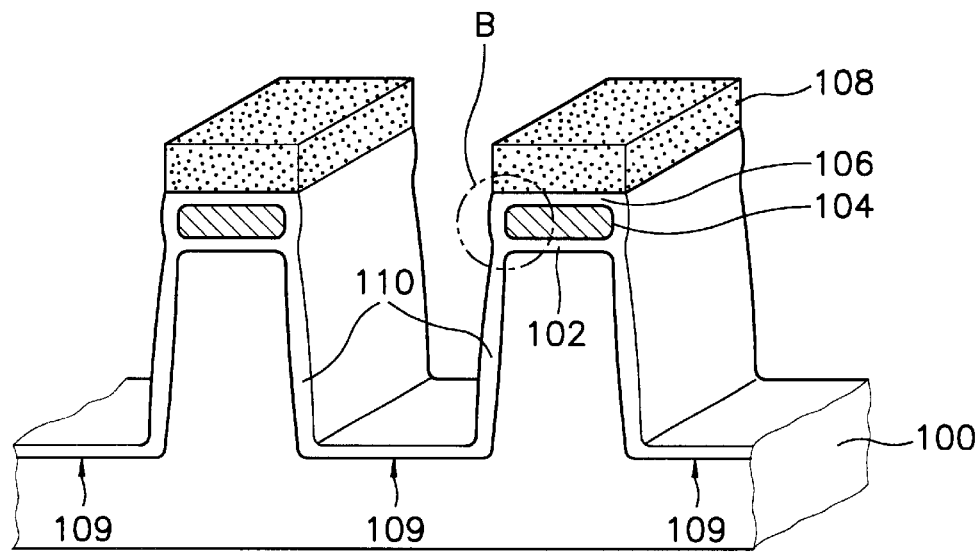

Referring to FIG. 2D, the inner surface portion of the trench 109 is treated in the oxidation atmosphere to eliminate damage caused by high energy ion impact during trench etching and to prevent leakage current during device operation. Then, a trench oxide layer 110 is formed along the inner surface of trench 109, i.e., the bottom plane and sidewalls thereof, to the thickness of about 10 to 500 Å, preferably 30 to 40 Å. The trench oxide layer 110 may be formed by a dry oxidation process in an atmosphere of nitride $N_2$ and oxygen $O_2$ at a temperature of 800 to 950° C., or by a wet oxidation process at a temperature of at least 700° C.

As widely-known in the art, a reaction for forming the oxide layer is written as below:

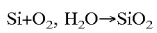

$$Si+O_2, H_2O \rightarrow SiO_2$$

As noted from the above reaction, since the diffusion of oxygen into the layer having the silicon Si source effects oxidation of silicon, an oxide layer is grown on the surface of the silicon layer pattern 104 and on the surfaces of trench 109.

Figure 3:
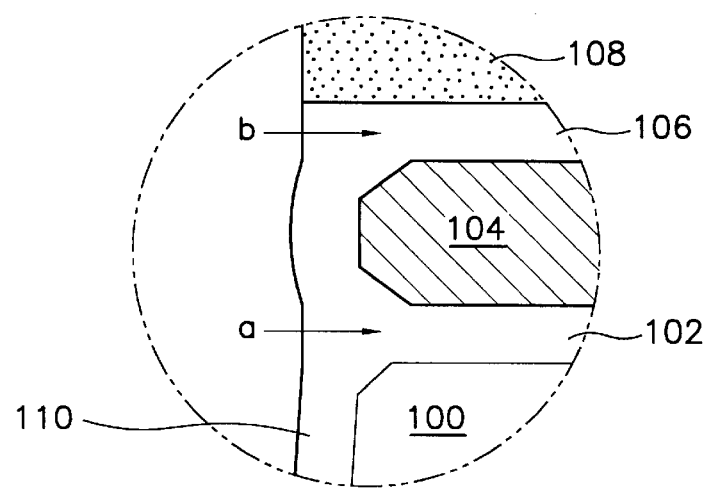
FIG. 3 is an enlarged sectional view showing portion B of FIG. 2D.

FIG. 3 is an enlarged sectional view showing the portion B of FIG. 2D.

When forming trench oxide layer 110, as shown in FIG. 3, an oxidant (or oxidizing gas) intrudes into the sides of the gate oxide layer pattern 102 at the lower portion of the silicon layer pattern 104 to generate a first bird's beak "a." At the same time, the oxidant intrudes into the sides of the buffer oxide layer pattern 106 at the lower portion of stopping layer pattern 108 to form a second bird's beak "b" at the upper portion of the first polysilicon layer pattern 104.

Figure 1A:
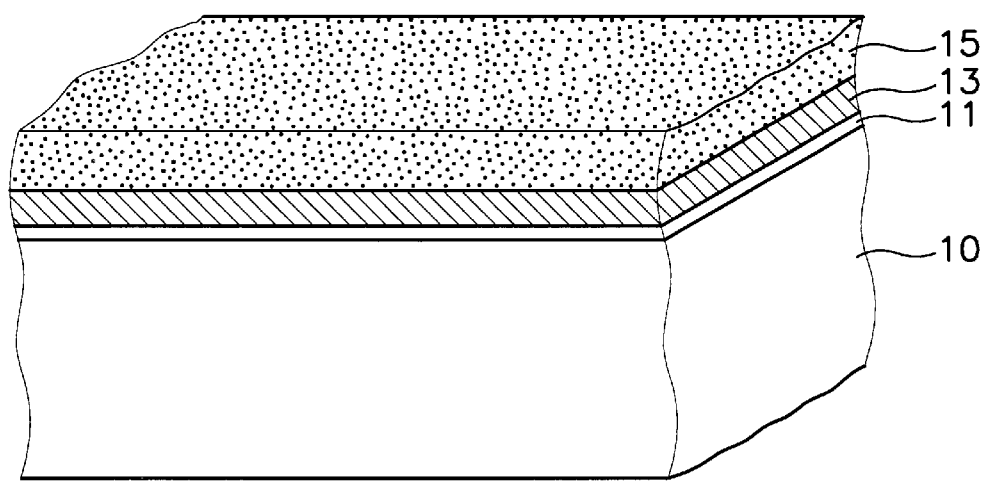
FIGS. 1A to 1E illustrate a method of manufacturing a flash memory device having self-aligned shallow trench isolation regions according to the prior art.
Figure 1B:
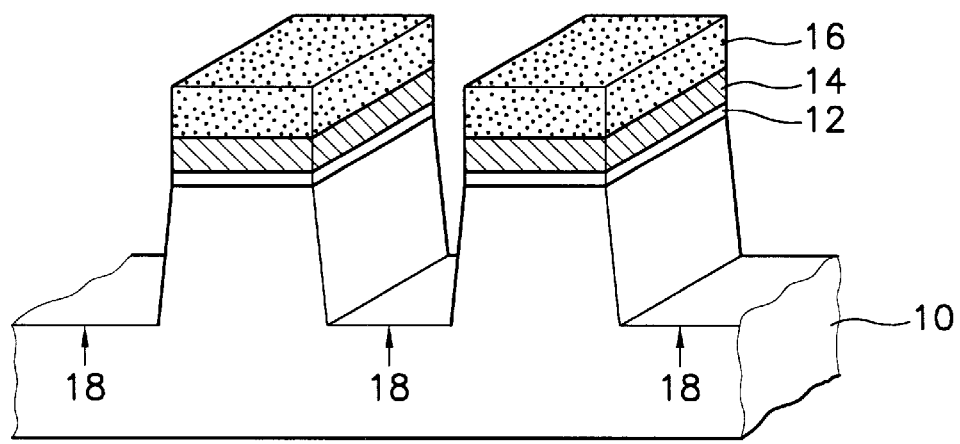
Figure 1C:
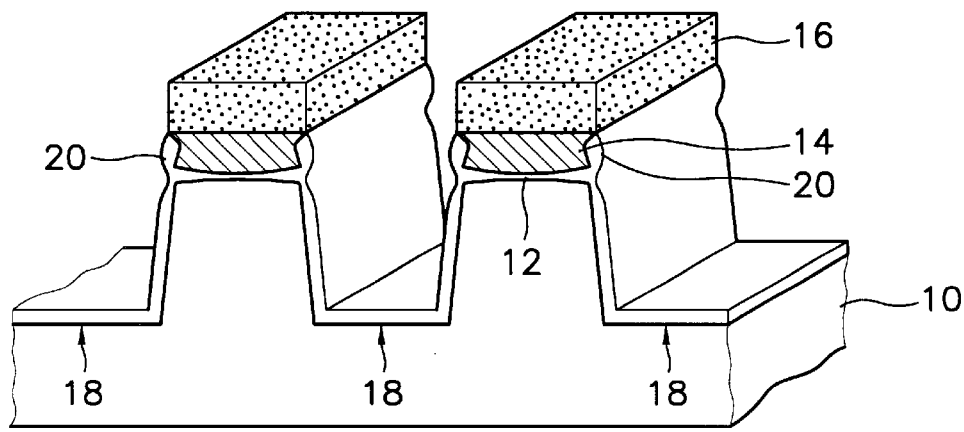
Figure 1D:
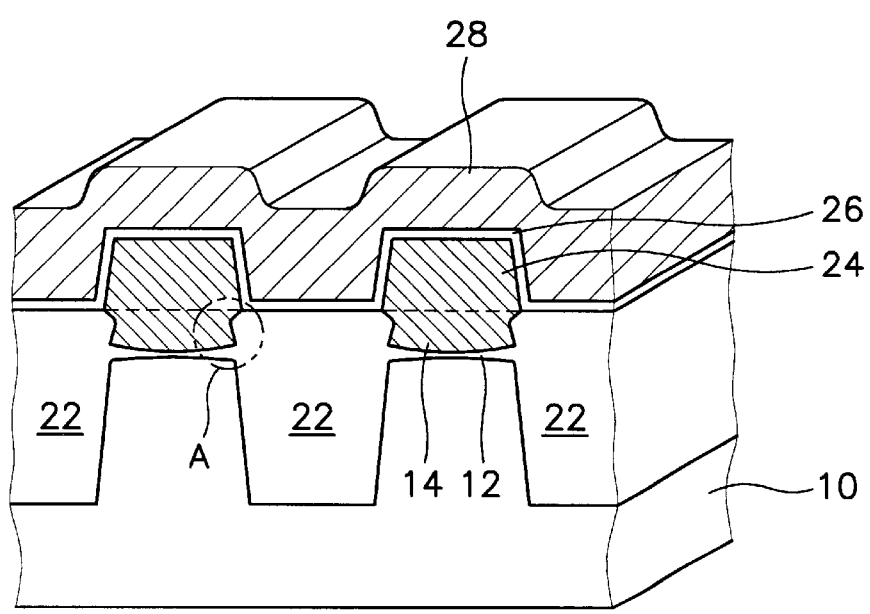
Figure 1E:
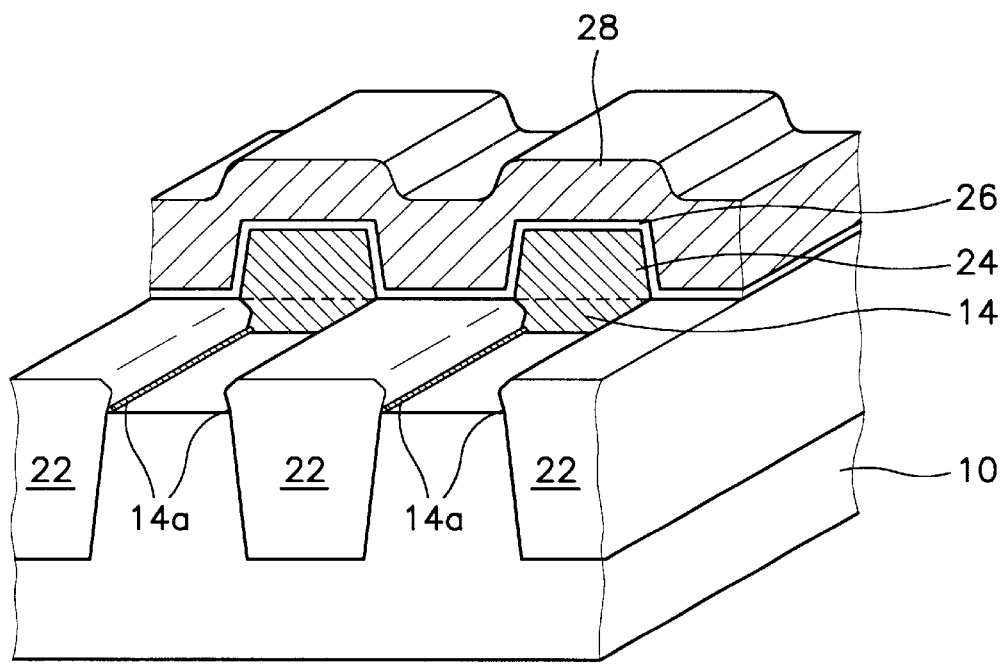

According to a conventional method as shown in FIG. 1C, the bird's beak is created only at the lower portion of the silicon pattern used as the floating gate. While the oxide grown at the bottom edge portion of the floating gate swells during oxidation thereof, the lower portion of the gate sidewall takes on a positive slope. In contrast, in the present invention, a first bird's beak "a" and a second bird's beak "b" are simultaneously formed at lower and upper portions of the gate sidewalls. As such, no outward bending occurs at the bottom edge portion of the gate sidewall. In other words, simultaneous formation of the second bird's beak "b" at the upper portion of the first silicon layer pattern 104 prevents the positive slope that would otherwise occur. Consequently, in accordance with an important aspect of the invention, the floating gate formed in silicon layer pattern 104 has the desirable profile.

Figure 2E:
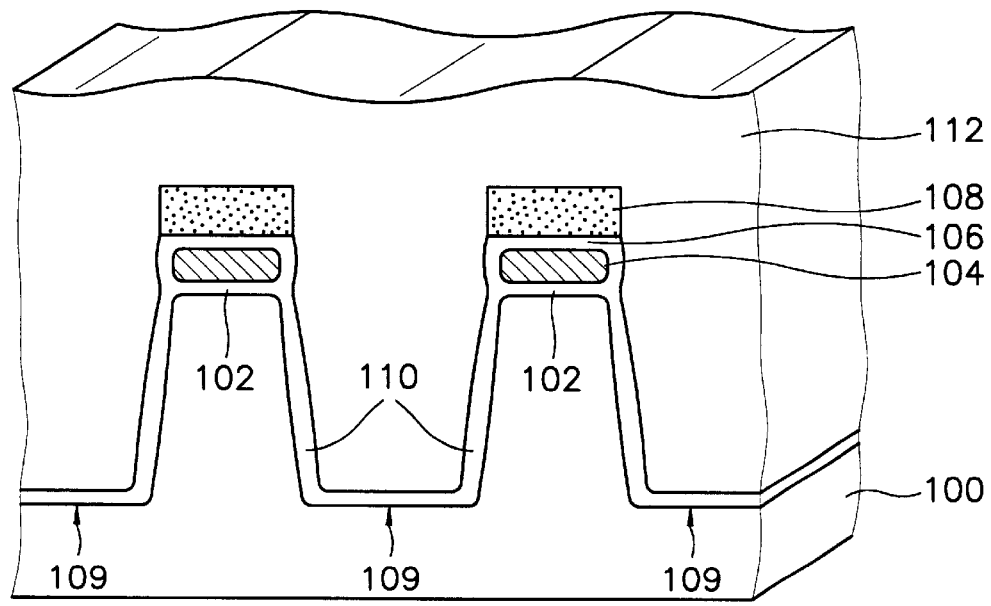

Referring to FIG. 2E, an oxide layer 112 with good gap-filling characteristics, e.g., USG (undoped silicate glass), $O_3$-TEOS (tetra-ethyl ortho-silicate) USG or HDP oxide layer, is deposited via a CVD process to the thickness of about 5000 Å in order to fill trench 109. Preferably, high density plasma (HDP) oxide layer 112 is deposited using $SiH_4$, $O_2$, Ar, or He gases as a plasma source.

Trench 109 is filled by enhancing the gap filling capability of the HDP oxide layer 112 so as not to cause leaks or voids inside trench 109.

When the HDP oxide layer 112 is formed, deposition of the oxide layer and a sputter etch of the oxide layer are simultaneously executed. Thus, while it is deposited in a constant speed over a wide area, the depositing speed and sputter etching speed become identical with each other after being deposited to a prescribed thickness at a narrow area so that the oxide is not further deposited. If the sputter etch capability is increased to improve gap filling characteristics of the HDP oxide layer 112, the edge portion of the nitride-containing stopping layer pattern 108 is eroded to cause the field oxide layer to assume a negative slope. In order to prevent this problem, a method of eliminating the negative slope of the field oxide layer may be achieved by altering the deposition condition or by using a wet etchant when forming stopping layer 108.

Successively, a capping oxide layer (not shown) formed of PE-TEOS (plasma-enhanced TEOS) may be deposited on the HDP oxide layer 112 via a plasma method which uses $Si(OC_2H_5)_4$ as a source.

Optionally, the HDP oxide layer 112 is densified by annealing at a high temperature of about 800 to 1050° C. in an inert gas atmosphere to lower the wet etch rate with respect to a subsequent cleaning process.

Figure 2F:
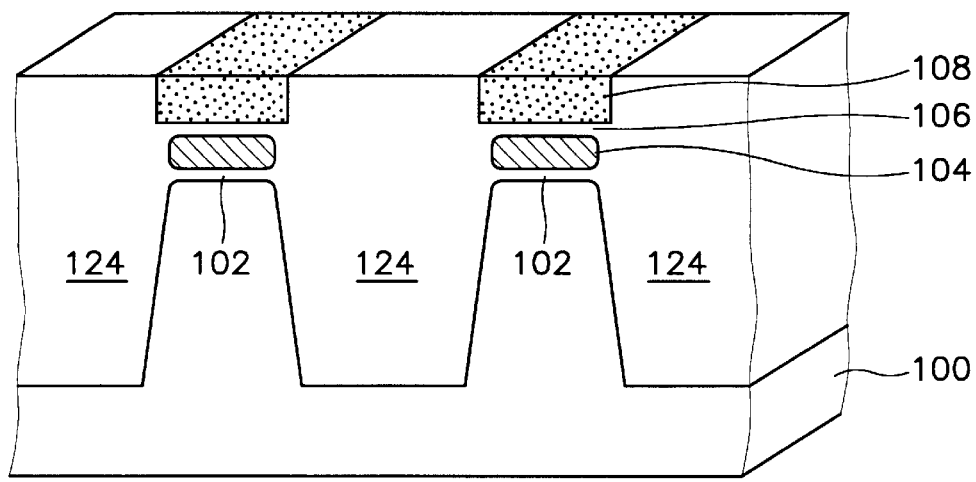

Referring to FIG. 2F, the HDP oxide layer 112 is planarized. Planarization is performed via an etchback or CMP process until the upper surface of the stopping layer pattern 108 is exposed. Thus, the HDP oxide layer 112 on the stopping layer is partially removed to thereby create field oxide separations in trenches 109.

Figure 2G:
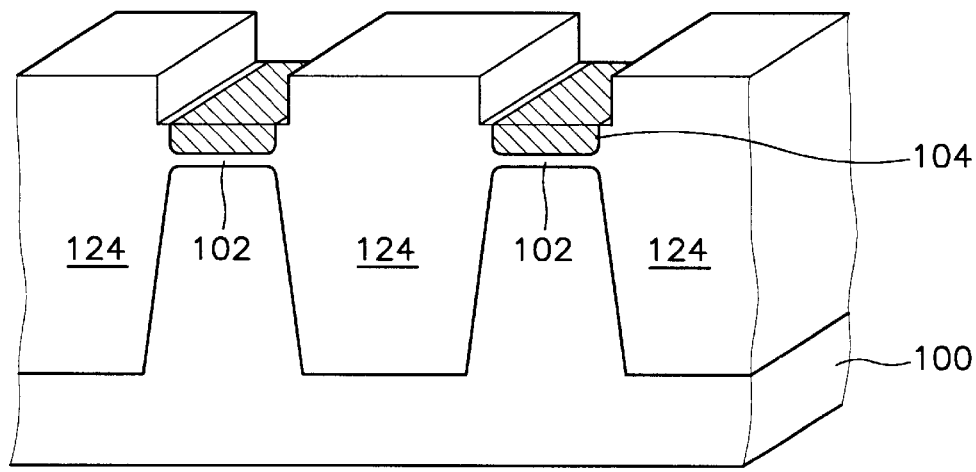

Referring FIG. 2G, the stopping layer pattern 108 comprising silicon nitride is removed via a stripping process using phosphoric acid. At this time, the buffer oxide layer pattern 106 prevents damage upon the underlying silicon layer pattern 104 which is the first floating gate formed of the silicon during the process of removing the silicon nitride by the stripping process.

Thereafter, a pre-cleaning step is performed to clean the substrate for about 30 seconds using an etchant including fluoride acid. The field oxide layer 124 is partially removed by stripping the stopping layer pattern 108 and by the pre-cleaning process, and the buffer oxide layer pattern 106 formed on the silicon layer pattern 104 is also removed. At this time, the thickness of approximately over 250 Å of the field oxide layer 124 is reduced.

Figure 2H:
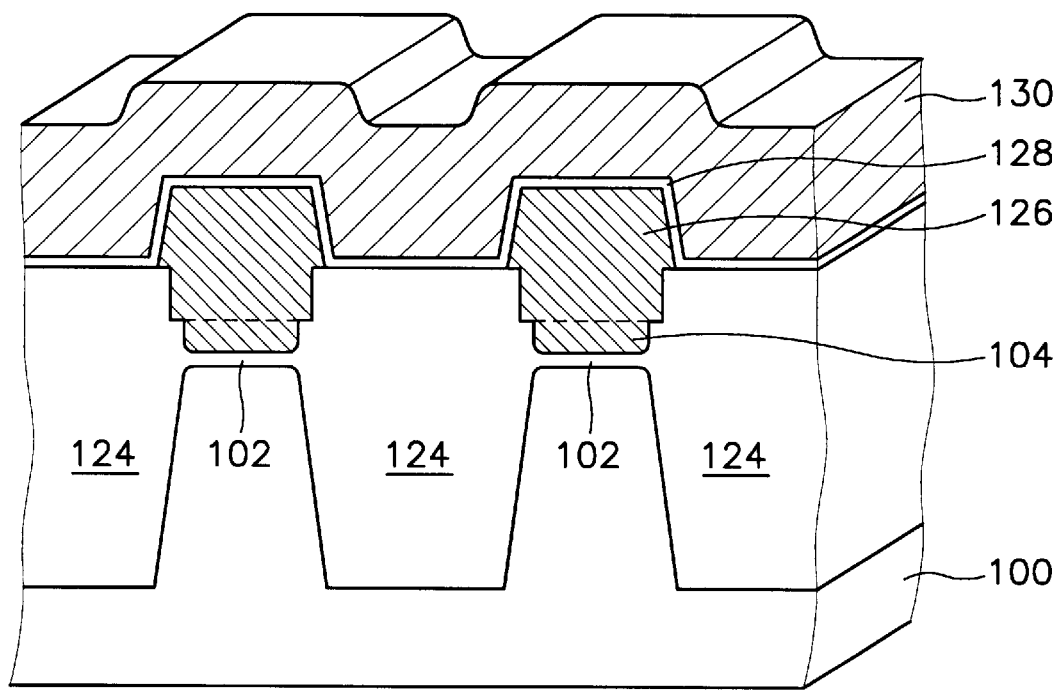
Figure 21:
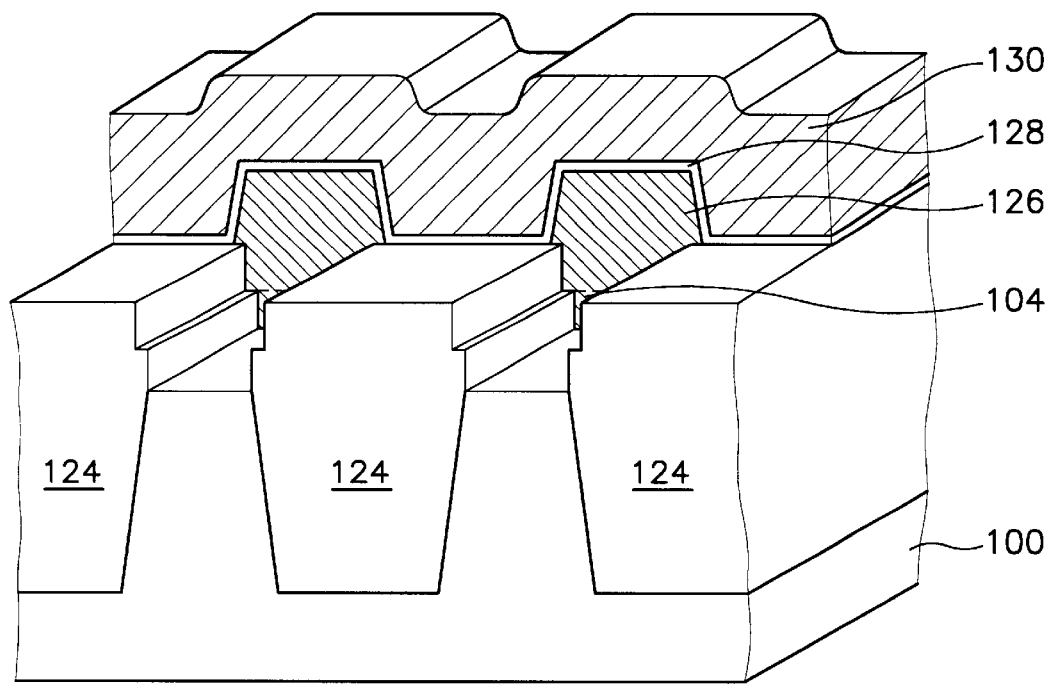

Referring to FIG. 2H, a second silicon layer (not shown) such as a polysilicon layer or an amorphous silicon layer is deposited by known methods, e.g., by chemical vapor deposition (CVD), on exposed the first silicon layer pattern 104 and the field oxide layer 124 (FIG. 2G) via a LPCVD method to a thickness of about 2000 angstrom. Dopants or other charge carriers are generally included during formation of the conductive silicon layer pattern 104. The second silicon layer thus deposited lies in electrical contact with the first silicon layer pattern 104, which is the first floating gate. Subsequently, a second floating gate 126 is doped with a high density N-type impurity via a typical doping method, e.g., $POCL_3$ diffusion, ion implantation or in-situ doping, thereby forming a second conductive layer.

Additionally, without performing a separate doping process, the second conductive layer may be formed in such a manner that impurity-doped polysilicon is deposited by performing the CVD method while adding an impurity to the source gas during forming the second silicon layer. The second floating gate formed by the second conductive layer is formed in order to increase the area of a dielectric interlayer formed in a subsequent process, which is preferably formed as thick as possible.

Thereafter, the second conductive layer on the field oxide layer 124 is partially removed via a conventional photolithograpy process to form a second silicon layer pattern 126 which constitute the second portion of the floating gates. Then, the thus formed second floating gates are separated from those of the neighboring cells one another.

Successively, a dielectric interlayer 128 formed of ONO is formed on the entire surface of the resulting structure to completely insulate second silicon patterns 126 being the second floating gates. For example, after the second floating gates 126 are oxidized to grow a first oxide layer to the thickness of about 100 Å, the nitride layer is deposited thereon to the thickness of about 130 Å and a second oxide layer to the thickness of about 40 Å is deposited on the nitride layer, thereby forming the dielectric interlayer 128 of about 100 to 200 Å thick in total.

Then, a control gate layer 130 which is a third conductive layer obtained by stacking an $N^+$ type-doped polysilicon layer and a metal silicide layer such as tungsten silicide WSix, titanium silicide TiSix, cobalt silicide CoSix, and tantalum silicide TaSix is formed on the dielectric interlayer 128. Preferably, the polysilicon layer of the control gate layer 130 is formed to a thickness of about 1000 Å and metal silicide layer thereof is formed to a thickness of about 100 to 1500 Å.

Referring to FIG. 2I, after patterning the control gate layer 130 via the photolithography process, the exposed dielectric interlayer 128, the second floating gate segment 126, and the first floating gate segment 104 are successively patterned in each cell unit via a dry etch method, thereby forming the stacked floating gate memory cell. At this time, dry etching is performed in certain regions until exposing the upper surface of substrate 100 between field oxide layers 124.

Because the sidewall of the first silicon layer pattern 104 as the first floating gate has no positive slope, the sidewall portion of first silicon layer pattern 104 is not deformed and has no externally bending portion. Consequently, that portion of the first silicon layer pattern 104 exposed by the mask pattern is completely removed during the above-described dry etch process. Therefore, silicon residue does not remain at the surface boundary between the field oxide layer 124 and the active region.

Thereafter, even though not shown in the drawing, the source/drain regions of the memory cell are formed by ion implantation, and interlayer insulating layer ILD is then coated on the resultant structure. After forming a contact hole for exposing the source/drain regions by etching the interlayer insulating layer, a contact plug for filling up the contact hole is formed. Then, a metallization layer electrically in contact with the contact plug is deposited, and a back-end process is performed by using the interlayer insulating layer IMD, via and metal mask.

The processes as shown in FIGS. 2B and 2C of the first embodiment are respectively performed in separate etching chambers which, however, may be successively performed in a single etching chamber thereby to establish a second embodiment. This second embodiment is the same as the first embodiment except that the anti-reflective layer is not formed and the substrate etching process is performed in a single etching chamber using a photoresist as an etch mask. Here, the same reference numerals as in the first embodiment are used for denoting the same members.

Figure 4A:
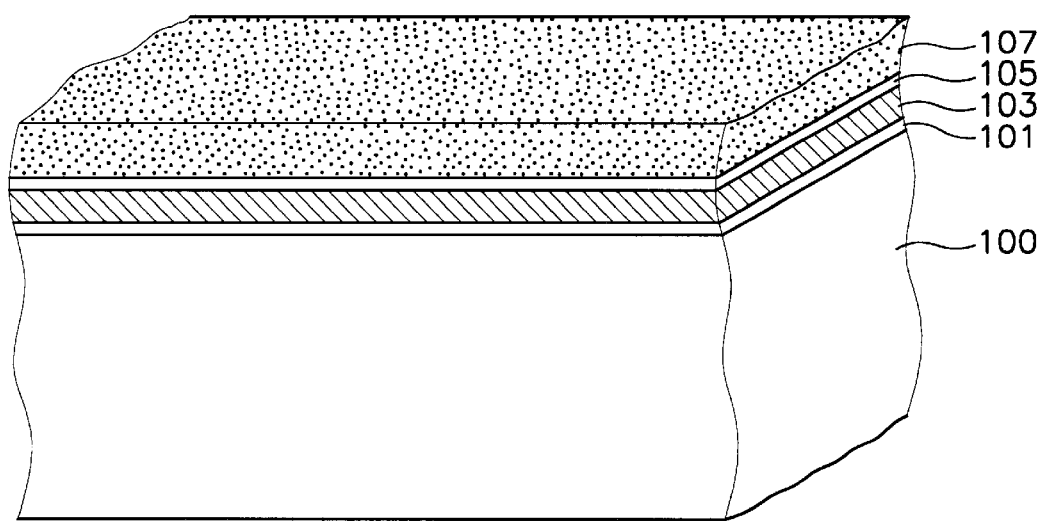
FIGS. 4A and 4B illustrate a method of manufacturing a floating gate of a memory device according to a second embodiment of the present invention.
Figure 4B:
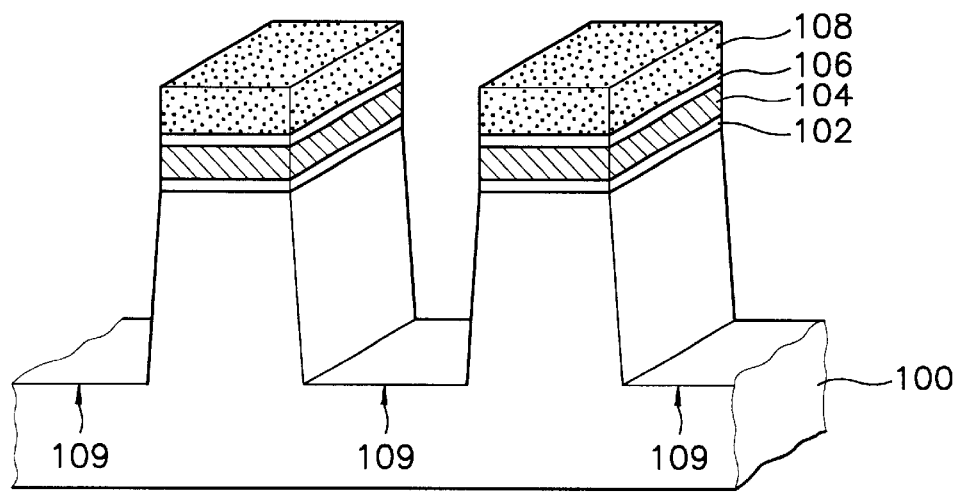

FIGS. 4A and 4B are sectional views for showing a method for manufacturing a non-volatile memory device according to the second embodiment of the present invention.

Referring to FIG. 4A, in the same manner as in the first embodiment, a gate oxide layer 101, a first silicon layer 103, a buffer oxide layer 105, and a stopping layer 107 are sequentially formed on substrate 100.

Referring to FIG. 4B, using a photo mask for defining a floating gate, a photoresist pattern 160 is formed on the stopping layer 107 as in the first embodiment. Then, the stopping layer 107, the buffer oxide layer 105, the first silicon layer 103, and the gate oxide layer 101 are patterned by using the photoresist pattern 160 as an etch mask so that a pattern structure formed by the stopping layer pattern 108, the buffer oxide layer pattern 106, the first silicon layer pattern 104, and the gate oxide layer pattern 102 is formed.

Next, substrate 100 is etched to form a trench 109, and an ashing or a strip process is performed to remove the photoresist pattern 160.

Thereafter, the processes shown in FIGS. 2C to 2I of the first embodiment are performed thereby providing a floating gate non-volatile memory device in accordance with a second aspect of the invention.

According to the invention described above, a buffer oxide layer is additionally formed between a first segment of a floating gate layer and stopping layer to create a bird beak at the upper portion of the floating gate. During subsequent oxidizing of the sidewall of the trench, bird beaks at upper and lower portions of the first segment of the floating gate even out or effect smoothing of the sidewall portions of the floating gate. As such, undesirable sloping of the sidewalls of the floating gate layer is prevented and a non-volatile memory device having a gate with a desirable profile is obtained.

In addition, silicon residue does not remain after dry etching to form the subsequent gate. The absence of this residue helps avoid electrical failures of the device caused by short circuiting among the neighboring gates.

It is also apparent that, in addition to the uniform formation of a floating gate layer, the invention has application in the formation of other conductive layers within a semiconductor device where uniformity is desired. In other words, the invention has application wherever there is a need to avoid the bird's beak phenomenon described herein.

While the present invention has been particularly shown and described with reference to illustrative embodiments thereof, it will be understood by those skilled in the art that various changes in form and details may be effected without departing from the spirit and scope of the invention as defined by the appended claims.

What is claimed is:

1. In a self-alignment method of forming a floating gate and associated active region in a substrate of a semiconductor memory device, a method comprising:

forming a gate oxide layer on the substrate;

forming a first conductive layer on the gate oxide layer;

forming a buffer oxide layer on the first conductive layer;

forming a stopping layer on the buffer oxide layer;

patterning the stopping layer and buffer oxide layer and forming a stopping layer pattern and a buffer oxide layer pattern;

patterning the first conductive layer to form a floating gate layer as a first conductive layer pattern, and etching the gate oxide layer and the upper portion of the substrate to form a gate oxide layer pattern and a trench;

oxidizing an inner surface portion of the trench to form a trench oxide layer in the inner surface portion of the trench, and forming a bird's beaks at upper and lower portions of the floating gate layer to prevent the formation of a positive profile at sidewalls of the patterned floating gate layer; and forming a field oxide layer for filling up the trench, wherein the field oxide layer is formed by forming an oxide layer covering the stopping layer while filling up the trench, and etching the oxide layer to have a smooth surface via at least one of a chemical mechanical polishing method and an etchback method until the surface of the stopping layer pattern is exposed.

2. In a self-alignment method of forming a floating gate and associated active region in a substrate of a semiconductor memory device, a method comprising:

forming a gate oxide layer on the substrate;

forming a first conductive layer on the gate oxide layer;

forming a buffer oxide layer on the first conductive layer;

forming a stopping layer on the buffer oxide layer;

forming an anti-reflective layer on the stopping layer by chemical vapor deposition;

patterning the anti-reflective layer, stopping layer and buffer oxide layer and forming an anti-reflective layer pattern, a stopping layer pattern and a buffer oxide layer pattern;

patterning the first conductive layer to form a floating gate layer as a first conductive layer pattern, and etching the gate oxide layer and the upper portion of the substrate to form a gate oxide layer pattern and a trench;

oxidizing an inner surface portion of the trench to form a trench oxide layer in the inner surface portion of the trench, and forming a bird's beaks at upper and lower portions of the floating gate layer to prevent the formation of a positive profile at sidewalls of the patterned floating gate layer; and forming a field oxide layer for filling up the trench.

3. The method as claimed in claim 2, wherein the anti-reflective layer comprises at least one material selected from the group consisting of polysilicon, silicon nitride, silicon oxynitride and silicon oxide.

4. The method as claimed in claim 2, wherein, in a first etching chamber, after a photoresist pattern for forming the floating gate is formed on the anti-reflective layer, the anti-reflective layer, the stopping layer, and the buffer oxide layer are patterned by using the photoresist pattern as an etch mask and the photoresist pattern is removed, and then, in a second etching chamber, the first conductive layer pattern, the gate oxide layer pattern, and the trench are formed while the anti-reflective layer pattern is removed.

5. The method as claimed in claim 2, further comprising:

forming a photoresist pattern on the stopping layer for forming the floating gate;

performing successive etching processes in a single chamber using the photoresist pattern as an etch mask to pattern the stopping layer, the buffer oxide layer, the first conductive layer, and the gate oxide layer; and in the same single chamber, etching the upper portion of the substrate to form the stopping layer pattern, the buffer oxide layer pattern, the first conductive layer pattern, the gate oxide layer pattern, and the trench.

6. A method of manufacturing a floating gate structure of a non-volatile memory device comprising:

forming a gate oxide layer on a semiconductor substrate;

forming a first conductive layer on the gate oxide layer;

forming a buffer oxide layer on the first conductive layer;

forming a stopping layer on the buffer oxide layer;

patterning the stopping layer, the buffer oxide layer, the first conductive layer, the gate oxide layer and the substrate using a single mask for forming a floating gate from the first conductive layer, and, simultaneously, forming a trench aligned with the floating gate in the substrate adjacent to the floating gate for defining an active region of the substrate;

oxidizing an inner surface portion of the trench to form a trench oxide layer in the inner surface portion of the trench, and forming bird's beaks at upper and lower portions of the floating gate layer to prevent formation of a positive profile at the sidewall of the patterned floating gate layer;

forming a field oxide layer for filling up the trench;

planarizing the field oxide layer with the surface of an oxidizing preventing layer;

removing the patterned stopping layer; and successively forming a dielectric interlayer and a control gate on the floating gate, after forming the field oxide layer.

7. A method of manufacturing a floating gate structure of a non-volatile memory device comprising:

forming a gate oxide layer on a semiconductor substrate;

forming a first conductive layer on the gate oxide layer;

forming a buffer oxide layer on the first conductive layer;

forming a stopping layer on the buffer oxide layer;

forming an anti-reflective layer on the stopping layer by chemical vapor deposition;

patterning the stopping layer, buffer oxide layer, first conductive layer, gate oxide layer and substrate using a single mask for forming a floating gate from the first conductive layer, and, simultaneously, forming a trench aligned with the floating gate in the substrate adjacent to the floating gate for defining an active region of the substrate;

oxidizing an inner surface portion of the trench to form a trench oxide layer in the inner surface portion of the trench, and forming bird's beaks at upper and lower portions of the floating gate layer to prevent formation of a positive profile at the sidewall of the patterned floating gate layer; and forming a field oxide layer for filling up the trench.

8. The method of manufacturing a memory device as claimed in claim 7, wherein the anti-reflective layer comprises at least one material selected from the group consisting of polysilicon, silicon oxynitride, and silicon oxide.

9. The method as claimed in claim 1, wherein the first conductive layer comprises one of polysilicon and amorphous silicon.

10. The method as claimed in claim 1, wherein the material of the stopping layer includes a nitride component.

11. The method as claimed in claim 1, wherein the buffer oxide layer is thermal oxidation.

12. The method as claimed in claim 1, wherein the buffer oxide layer is formed by plasma-enhanced chemical vapor deposition.

13. The method as claimed in claim 1, wherein the buffer oxide layer is formed by oxidizing the surface of the first conductive layer by plasma treatment of an oxidizing gas.

14. The method as claimed in claim 13, wherein the oxidizing gas comprises at least one of oxygen ($O_2$) and nitrous oxide ($N_2O$).

15. A method as claimed in claim 1, wherein the buffer oxide layer is formed to a thickness of 10 to 500 Å.

16. The method of manufacturing a memory device as claimed in claim 6, wherein the first conductive layer comprises at least one of polysilicon and amorphous silicon.

17. The method of manufacturing a memory device as claimed in claim 6, wherein the stopping layer includes a nitride component.

18. The method of manufacturing a memory device as claimed in claim 6, wherein the buffer layer comprises an oxide that is formed by thermal oxidation.

19. The method of manufacturing a memory device as claimed in claim 6, wherein the buffer layer is an oxide formed by oxidizing the surface of the first conductive layer via the plasma treatment of the surface with an oxidizing gas.

20. The method of manufacturing a memory device as claimed in claim 19, wherein the oxidizing gas comprises at least one of oxygen ($O_2$) and nitrous oxide ($N_2O$) gas.

* * * * *